United States Patent
Chidambarrao et al.

(10) Patent No.: US 7,534,667 B2
(45) Date of Patent: May 19, 2009

(54) STRUCTURE AND METHOD FOR FABRICATION OF DEEP JUNCTION SILICON-ON-INSULATOR TRANSISTORS

(75) Inventors: Dureseti Chidambarrao, Weston, CT (US); Brian J. Greene, Yorktown Heights, NY (US); John J. Ellis-Monaghan, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 11/308,685

(22) Filed: Apr. 21, 2006

(65) Prior Publication Data

US 2007/0249126 A1 Oct. 25, 2007

(51) Int. Cl.
*H01L 21/426* (2006.01)
(52) U.S. Cl. .................. 438/163; 438/306; 438/517; 438/527; 257/E21.337
(58) Field of Classification Search ............ 438/517
See application file for complete search history.

(56) References Cited

U.S. PATENT DOCUMENTS

| 6,294,413 | B1 * | 9/2001 | Tseng | 438/164 |
| 2004/0142520 | A1 * | 7/2004 | Mouli | 438/197 |
| 2006/0088963 | A1 * | 4/2006 | Ipposhi | 438/197 |

* cited by examiner

*Primary Examiner*—Stephen W Smoot
(74) *Attorney, Agent, or Firm*—Daryl Neff; H. Daniel Schnurmann

(57) ABSTRACT

A structure and method for fabricating a transistor structure is provided. The method comprises the steps of: (a) providing a substrate including a semiconductor-on-insulator ("SOI") layer separated from a bulk region of the substrate by a buried dielectric layer. (b) first implanting the SOI layer to achieve a predetermined dopant concentration at an interface of the SOI layer to the buried dielectric layer. and (c) second implanting said SOI layer to achieve predetermined dopant concentrations in a polycrystalline semiconductor gate conductor ("poly gate") and in source and drain regions disposed adjacent to the poly gate, wherein a maximum depth of the first implanting is greater than a maximum depth of the second implanting.

8 Claims, 7 Drawing Sheets

Sxx at Gate Edge 5nm below Oxide

STRUCTURE AND METHOD FOR FABRICATION OF DEEP JUNCTION SILICON-ON-INSULATOR TRANSISTORS

BACKGROUND OF THE INVENTION

The present invention relates to the fabrication of semiconductor integrated circuits, and more specifically to a structure and method of forming an active semiconductor device in a semiconductor-on-insulator ("SOI") layer of an SOI substrate.

A field effect transistor ("FET") is a transistor that relies on an electric field to control the shape and ultimately the conductivity of a channel in a semiconductor material. FETs usually have three terminals, known as the gate, the drain and the source. The voltage applied between the gate and source terminals modulates the current between the source and drain terminals. There are two different types of FETs, a p-type FET or "PFET" and an n-type FET or "NFET". The voltage applied to the gate of a FET can increase the current flow from source to drain, or decrease the current flow from source to drain accordingly. In this way, when a gate voltage is applied to both an NFET and a PFET at a given value, one type of FET will be off, that is, not conducting, and the other type of FET will be on and conducting. The channel region of the FETs are either doped p-type to produce an NFET or doped n-type to produce a PFET.

The FETs in CMOS circuits can be provided in a bulk substrate or preferably in a semiconductor-on-insulator substrate such as a silicon-on-insulator (SOI) substrate. In a SOI substrate, active devices such as transistors and diodes are provided in a relatively thin single-crystal semiconductor layer that is separated from a bulk region of a substrate by an insulating layer. When field effect transistors (FETs) are formed in SOI substrates, faster switching operation is often achieved than otherwise. This is due to the fact that junction capacitance between the drain junction of the transistor and the bulk substrate is significantly reduced.

The amount of current that is conducted by a transistor when turned on can be increased greatly when a stress of sufficient magnitude is applied to the channel region of a transistor to induce a strain in the channel region. A variety of materials and techniques can be used to induce such stress. For example, in a substrate in which the active semiconductor region consists essentially of a single-crystal semiconductor such as silicon, a beneficial stress can be applied to the channel region of a FET by providing stressed regions of silicon germanium ("SiGe") in portions of the source and drain regions of the FET at edges of the channel region.

Referring to FIG. 1, a graph is provided which depicts a magnitude of stress applied by such SiGe regions to the channel region of a FET as a function of thickness of the SiGe regions. As best seen in the graph, the negative value of the stress ("Sxx") decreases monotonically, i.e., the magnitude of the stress applied to the channel region increases monotonically with the thickness ("tSiGe") of the SiGe regions. Clearly, within the range of depths shown in FIG. 1, the deeper that SiGe regions extend below the surface of the substrate, the greater the amount of stress is applied to the channel region of the FET.

Unfortunately, in SOI substrates, the thickness of SiGe regions adds to the total thickness of the SOI layer. For low junction capacitance characteristics, the source/drain implants must be designed to abut the buried oxide. When the SOI thickness becomes large, this becomes difficult to achieve without also undesirably implanting the channel region underneath the gate with the dopant used to implant and define the source/drain regions. Referring back to the problem of silicon thickness affecting short polysilicon gates, an example can be used. Let us assume that ordinarily the height of the polysilicon gate or Hpoly is around 100 nm in thickness, and the silicon thickness (Tsi) is at 70 nm. If the Tsi is increased to 100 nm to 120 nm range to achieve strong stress benefits associated with SiGe, then the implant design for this improved thickness and dopants also causes penetration of the polysilicon gate and counter-doping of the channel region below the gate with the source/drain implants (e.g., n-type dopant being undesirably implanted into the p-type doped channel region of the NFET)

Accordingly, it would be desirable to provide a structure and method for fabrication of transistor devices with extended and increased dopant depth that does not affect the channel region of these transistors.

SUMMARY OF THE INVENTION

According to an aspect of the invention, a structure and method are provided for fabricating a transistor. The method includes steps of: (a) providing a substrate including a semiconductor-on-insulator ("SOI") layer separated from a bulk region of the substrate by a buried dielectric layer. (b) first implanting the SOI layer to achieve a predetermined dopant concentration at an interface of the SOI layer to the buried dielectric layer. and (c) second implanting said SOI layer to achieve predetermined dopant concentrations in a polycrystalline semiconductor gate conductor ("poly gate") and in source and drain regions disposed adjacent to the poly gate, wherein a maximum depth of the first implanting is greater than a maximum depth of the second implanting.

According to a preferred aspect of that method the same structure can be used in fabrication of complementary metal oxide (CMOS) structures having differently polarized transistors.

DETAILED DESCRIPTION

Figure 1:
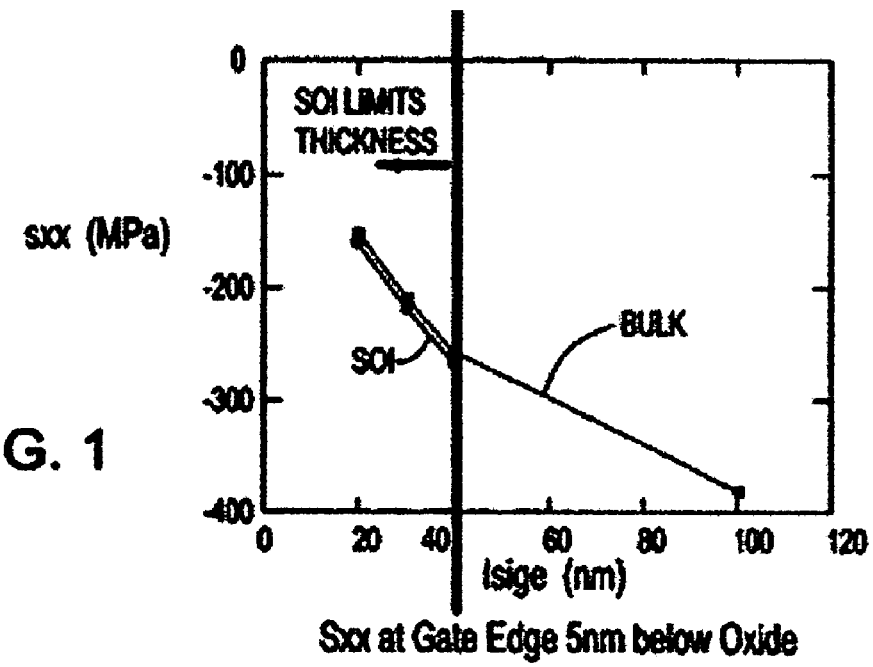
FIG. 1 is a graph depicting stress values achieved at a channel edge of a transistor versus a thickness of silicon germanium stressor regions.
Figure 2:
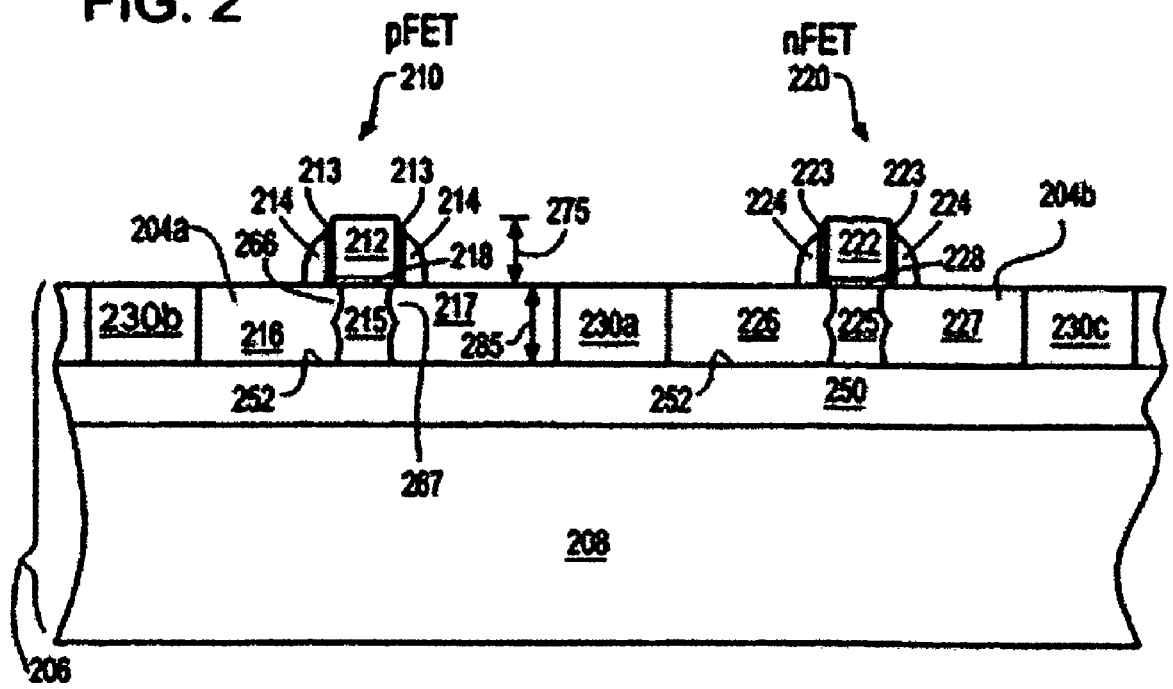
FIG. 2 is a sectional view of a PFET and an NFET in accordance with an embodiment of the invention.

FIG. 2 illustrates a structure according to an embodiment of the present invention which includes a PFET and an NFET, such as may be provided in a circuit using complementary metal oxide semiconductor ("CMOS") technology. In the various examples provided herein, techniques are described for fabricating both PFET and NFET transistors in accordance with embodiments of the invention. However, it will be understood that the structures and methods described herein can be applied to the structure and fabrication of an NFET alone or of a PFET alone, as well as to circuits which are implemented using only NFETs, circuits using only PFETs and circuits which use a combination of NFETs and PFETs.

FIG. 2 is a cross sectional view illustrating a p-type field effect transistor (PFET) 210 and an n-type field effect transistor (NFET) 220 in accordance with a first embodiment of the present invention. As illustrated in FIG. 2, the PFET 210 has a pair of source/drain regions 216 and 217 which are provided in a single-crystal active semiconductor region 204a. In addition, the NFET 220 has a pair of source/drain regions 226 and 227 provided in a single-crystal active semiconductor region 204b. The substrate 206 is preferably a semiconductor-on-insulator substrate such as a silicon-on-insulator (SOI) substrate in which a relatively thin layer of a single-crystal semiconductor is provided as an "SOI" layer. The SOI layer, which includes active semiconductor regions 204a and 204b, is separated from a bulk region 208 of the substrate by a buried insulating layer 250 or buried oxide ("BOX") layer 250. As shown in FIG. 2, the active semiconductor regions 204a and 204b are laterally separated and isolated from each other by a shallow trench isolation ("STI") region 230a. Similar STI regions 230b and 230c laterally separate each of the active semiconductor regions 204a and 204b from other active semiconductor regions (not shown) which are provided to the left of STI region 230b and to the right of STI region 230c.

A gate stack of the PFET includes a gate conductor 212, preferably which includes a polycrystalline semiconductor such as polysilicon. The gate conductor 212 overlies a channel region 215 in the active semiconductor region 204a, the gate conductor being separated from the channel region by a gate dielectric layer 218. By way of example, the thickness of the gate conductor, i.e., its height 275 above the gate dielectric layer 218 preferably is about 70 nm, and the thickness 285 of the SOI layer preferably is about 100 nm. Thus, the gate conductor is substantially shorter than the thickness 285 of the SOI layer. In this case, the gate conductor is about 30% shorter than the thickness of the SOI layer. In other examples, the percentage difference may be more or less, but still represents a substantial difference in the thickness.

The gate conductor is flanked laterally by dielectric spacers which typically include a relatively thin first spacer 213 and a thicker second spacer 214. By way of example, each of the first and second spacers may be formed by deposition of a dielectric and subsequent anisotropic etch, such as by a reactive ion etch. Alternatively, the first spacer may be formed by a reaction, e.g., oxidation, nitridation, with an exposed wall of the gate conductor.

Similarly, a gate stack of the NFET includes a gate conductor 222 including a polycrystalline semiconductor such as polysilicon, the gate conductor overlying a gate dielectric layer 228 above a channel region 225. The gate conductor of the NFET is flanked by dielectric spacers such as a thin first spacer 223 and a thicker second spacer 224. The height 275 of the gate conductor for the NFET preferably is the same as the height of the PFET gate conductor, as the gate conductor dimensions are usually defined simultaneously by the same process.

In the embodiment illustrated in FIG. 2, the source and drain regions of the PFET and NFET are deep structures that have junctions butting, i.e., adjoining the BOX layer 250. A predetermined dopant concentration is achieved in the deep source and drain regions at the interface 252 to the BOX layer 250, the dopant concentration being sufficiently high to avoid a p-n junction from being present between the source and drain regions and the SOI-BOX interface 252. As will be evident from the following description of processes according to embodiments of the invention, the deep source and drain structures are achieved without requiring the thickness of the poly gates 212, 222 (i.e., the height of the poly gates above the gate dielectric) from being correspondingly increased.

FIGS. 3 through 7 illustrate a process of fabricating the structure shown in FIG. 2 according to an embodiment of the invention. In the embodiment illustrated in FIGS. 3 through 7, the portions of the active semiconductor regions 204a, 204b of the substrate which will become the channel regions 215, 225 (FIG. 2) are masked with a sacrificial gate mask during an initial step of deep implanting the active semiconductor regions. Later, the sacrificial gate mask is removed and the actual gate is formed, after which implanting steps are performed which define the source and drain regions, halos and extension regions of the PFET and NFET.

Figure 3:
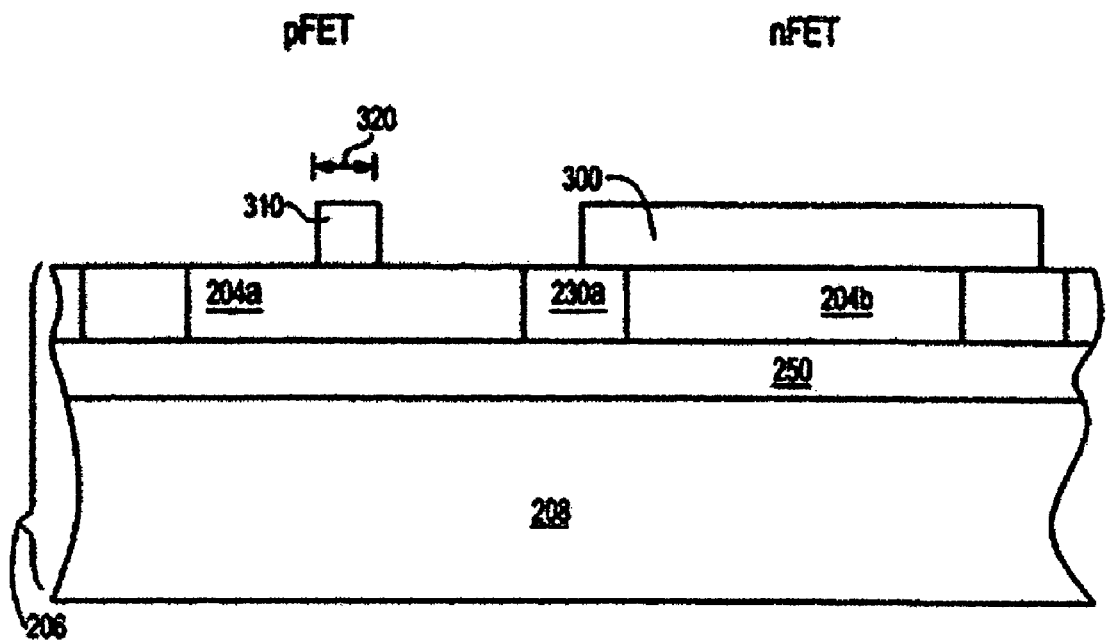
FIGS. 3 through 6 are sectional views illustrating stages in fabrication of a PFET and an NFET in accordance with one embodiment of the invention.

FIG. 3 is a sectional view illustrating an initial stage in the fabrication of a PFET and an NFET according to an embodiment of the invention. In this stage of fabrication, active semiconductor regions 204a, 204b have already been defined in the SOI substrate 206. The active semiconductor regions 204a, 204b are laterally separated from each other by an STI region 230a and vertically separated from the bulk region 208 of the substrate by a BOX layer 250.

As illustrated in FIG. 3, layer of masking material, for example, a photoresist material is deposited and patterned as a mask 300 covering the active semiconductor region 204b from which the NFET will be formed. In addition, a portion of the layer of masking material is patterned as a sacrificial gate mask 310 covering a portion of the active semiconductor region 204a from which the PFET will be formed. The sacrificial gate mask 310 is sized and disposed to cover the portion of the active semiconductor region 204a which will become the channel region 215 (FIG. 2) of the PFET. The sacrificial gate mask will be removed before final implants are made which define edges of the source and drain regions of the PFET in relation to the channel region. Thus, the sacrificial gate mask is not self-aligned to the channel region. For this reason, it is desirable that the sacrificial gate mask be larger than the actual gate that will be formed later. Preferably, the sacrificial gate mask 310 has a gate length 320 which is between about 20 nm and about 30 nm longer than the length of the gate conductor portion 212 (FIG. 2) of the gate.

Figure 4:
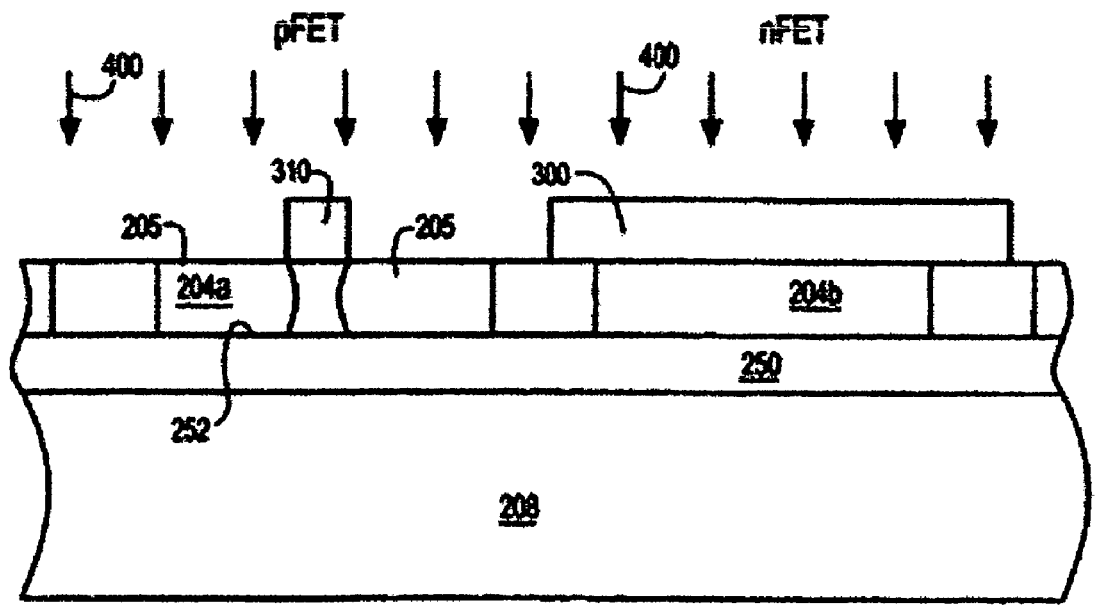

Next, as illustrated in FIG. 4, the active semiconductor region 204a is implanted with a p-type dopant, e.g., boron, when the SOI layer includes silicon. This implanting step is performed in the direction shown by the arrows 400. During the implanting step, the mask pattern 300 blocks the dopant from being implanted into the active semiconductor region 204b for the NFET. Mask pattern 310 blocks the dopant from being implanted into the portion of the active semiconductor region 204a that will become the channel region of the PFET while implanting the regions 205 which are not covered. The implanting step is performed as a deep implant to achieve a predetermined dopant concentration at a depth of the semiconductor region 204a at and near the interface 252 to the BOX layer 250. Preferably, the concentration of the dopant at the interface 252 is about $1 \times 10^{19}$ cm$^{-3}$. The implanting step is performed in a way to achieve a dopant concentration within a portion of the active semiconductor region 204a above the interface 252 as well. Thus, the dopant concentration at the interface 252 is within a "tail" portion of a distribution, e.g., Gaussian distribution, of the dopant. The concentration achieved at that tail portion of the distribution at the interface 252 preferably is about $1 \times 10^{19}$ cm$^{-3}$.

Figure 5:
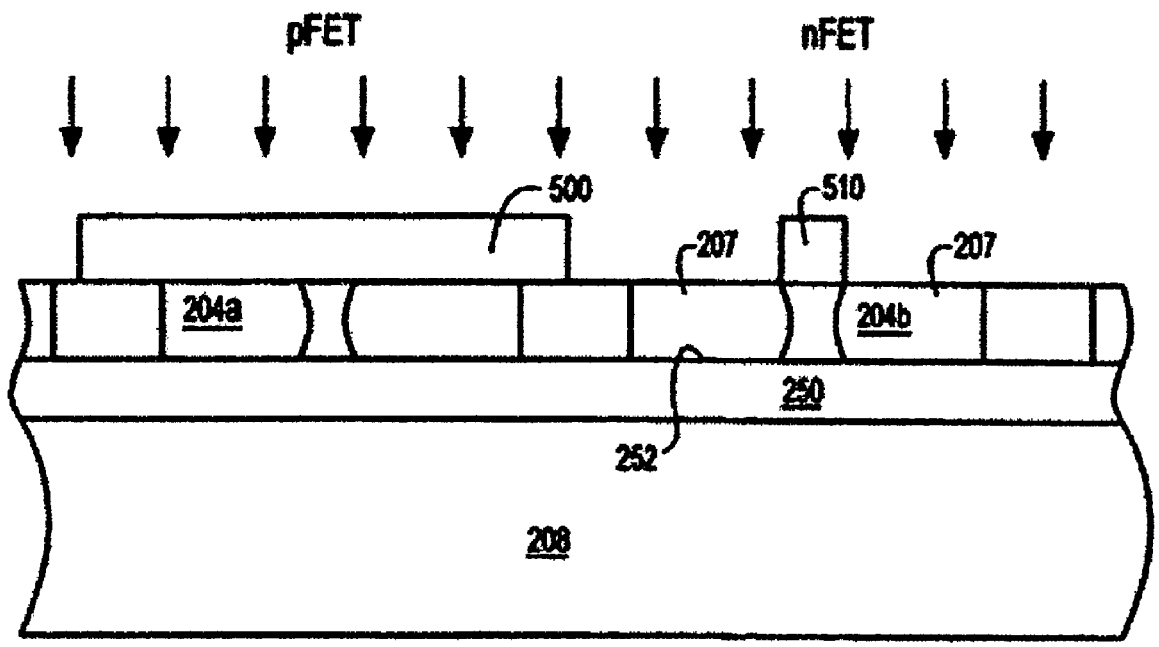

Referring to FIG. 5, after the implanting step, the mask patterns 300 and 310 are removed and mask patterns 500 and 510 are formed which cover the active semiconductor region 204a for the PFET and the portion of the active semiconductor region 204b which will become the channel region 225 (FIG. 2) of the NFET. The active semiconductor region 204b for the NFET is then implanted in the same way as described above with reference to FIG. 4, except in this case that the implant is performed using an n-type dopant, e.g., phosphorous. As in the case for the PFET (FIG. 4), the active semiconductor region 204b for the NFET is implanted to form deep implanted regions 207 having a dopant concentration of about $1 \times 10^{19}$ cm$^{-3}$ at the interface 252 to the BOX layer 250.

Figure 6:
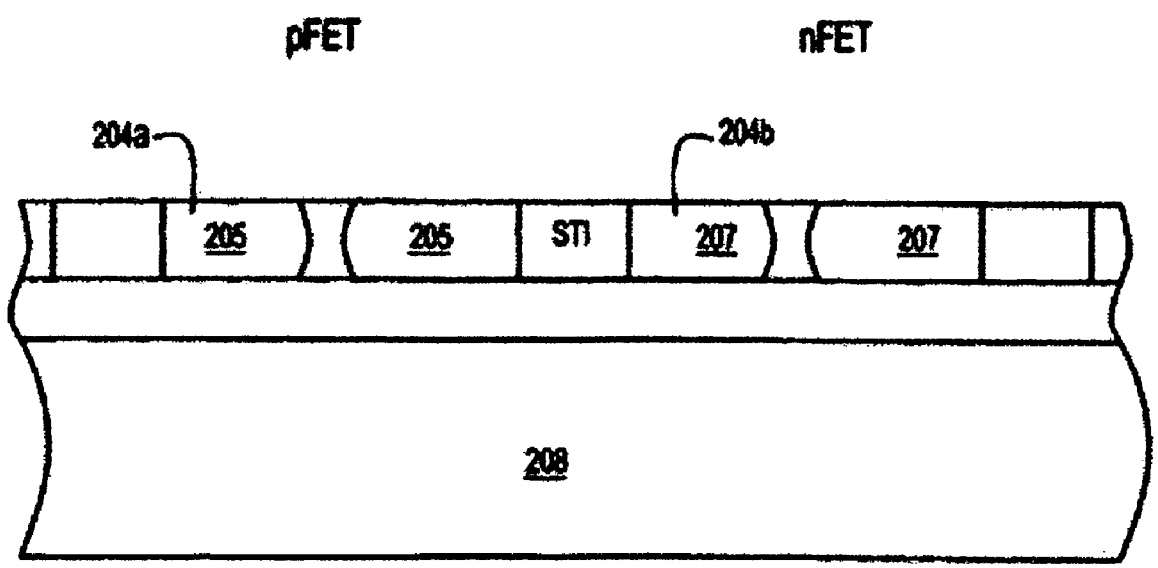

Thereafter, the masking patterns 500 and 510 are removed to reveal the active semiconductor region 204a for the PFET having the deep implanted regions 205 as shown in FIG. 6. In addition, the deep implanted regions 207 of the active semiconductor region 204a for the NFET are revealed as well.

Referring again to FIG. 2, subsequently, steps are performed to complete PFET 210 and NFET 220. Gate stacks are formed to overlie the active semiconductor regions 204a and 204b by known processes, each gate stack including a gate dielectric layer contacting the respective active semiconductor region and a gate conductor overlying the gate dielectric layer. Thereafter, to proceed processing the PFET, the active semiconductor region 204b and gate conductor 222 for the NFET are masked, e.g., with a patterned layer of photoresist material, and steps are performed to define the dopant profiles in the source and drain regions, extensions and/or halo regions of the PFET. Using the gate conductor 212 and first spacers 213 on walls of the gate conductor as a mask, halos and/or extension regions 266, 267 are implanted for the PFET. Thereafter, second spacers 214 are formed to overlie the first spacers, after which an implanting step is performed to form the source and drain regions 216, 217 of the PFET in establishing a dopant profile which is self-aligned to the gate conductor 212. Because the prior deep implanting of the active semiconductor region 204a establishes the full depth of the source and drain regions at the interface 252 to the BOX layer, the implanting steps performed now need not implant as deeply. Therefore, during these implanting steps, the exposed gate conductor 212 of the PFET is also implanted with a p-type dopant to a desirable depth that does not damage or risk damage to the gate dielectric of the PFET.

After performing the implanting steps for the PFET, the mask covering the active semiconductor region 204b for the NFET is removed and a similar mask is formed to cover the active semiconductor region 204a and gate conductor 212 of the PFET. Then, similar to the implants described above for making the PFET, steps are performed to implant extension regions and/or to form halo regions for the NFET. An implanting step using an n-type dopant (e.g., phosphorous) is performed to form the source and drain regions of the NFET in a manner self-aligned to the gate stack 222 and spacers thereon, and to implant the gate conductor 222 for the NFET to a desirable depth. In a variation of the above process, the implanting steps are performed for the NFET in the above-described manner before they are performed for the PFET, as no specific order is required. In another variation, the implanting step for forming the source and drain regions for each type of transistor can be performed first using a thick spacer. Thereafter, the thick spacer can be removed, a thinner spacer then provided and the implanting steps be then performed to form extension and/or halo regions.

As will be understood, the above-described process need not be applied only to the fabrication of structures including both a PFET and an NFET. Rather, the processing above can be used to fabricate either a PFET or an NFET or a plurality of PFETs, a plurality of NFETs or a combination of PFET and NFET devices.

Figure 7:
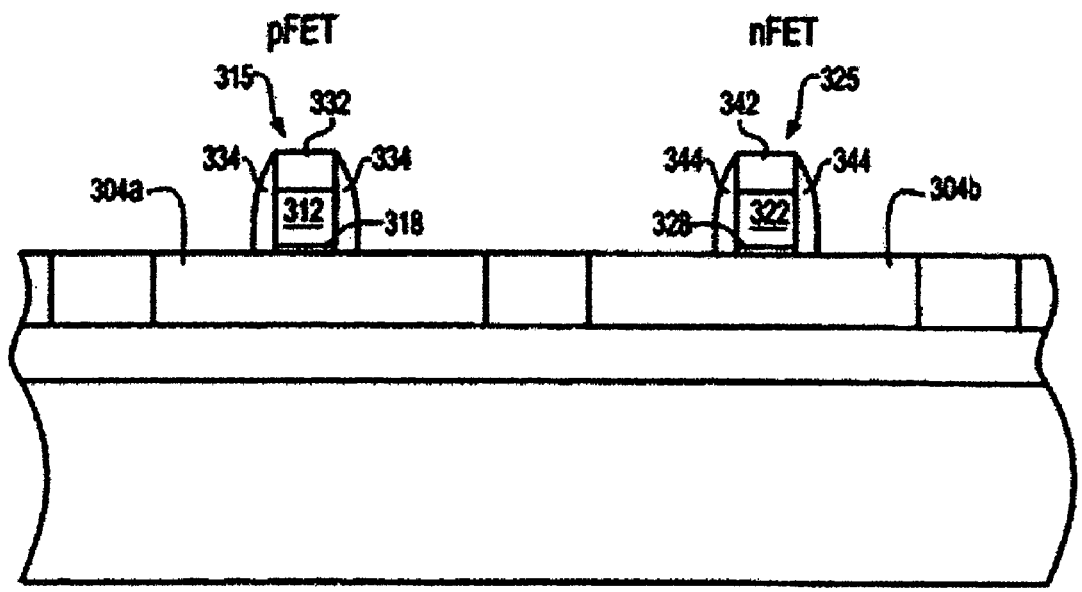
FIGS. 7 through 9 are sectional views illustrating stages in fabrication of a PFET and an NFET in accordance with a second embodiment of the invention.

Referring to FIG. 7, a method will now be described for fabricating a transistor structure in accordance with another embodiment of the invention. In this embodiment, before deep implanting steps are performed, gate stacks 315, 325 including final gate conductors 312, 322 are patterned first to overlie active semiconductor regions 304a, 304b for the respective PFET and NFET devices. In order to protect the gate conductors from the deep implants, the gate stacks are initially patterned with relatively thick dielectric (e.g., silicon nitride) caps 332, 342 overlying the polysilicon gate conductors 312, 322, respectively. In addition, dielectric spacers 344 are provided on walls of the gate conductors and walls of the nitride caps to control placement of the edges of the subsequently formed implanted regions.

Figure 8:
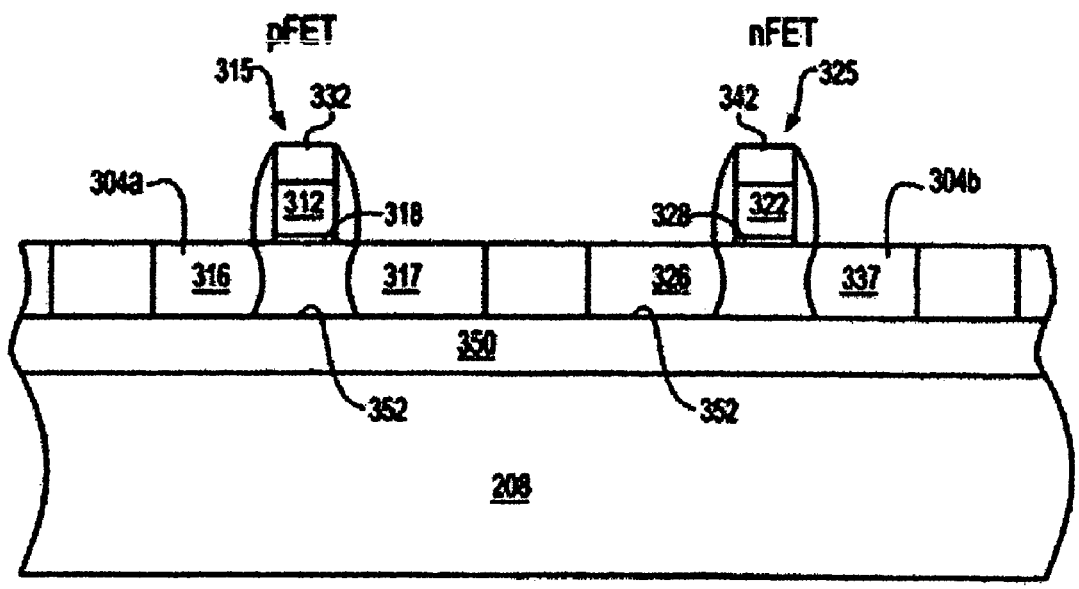
Figure 9:
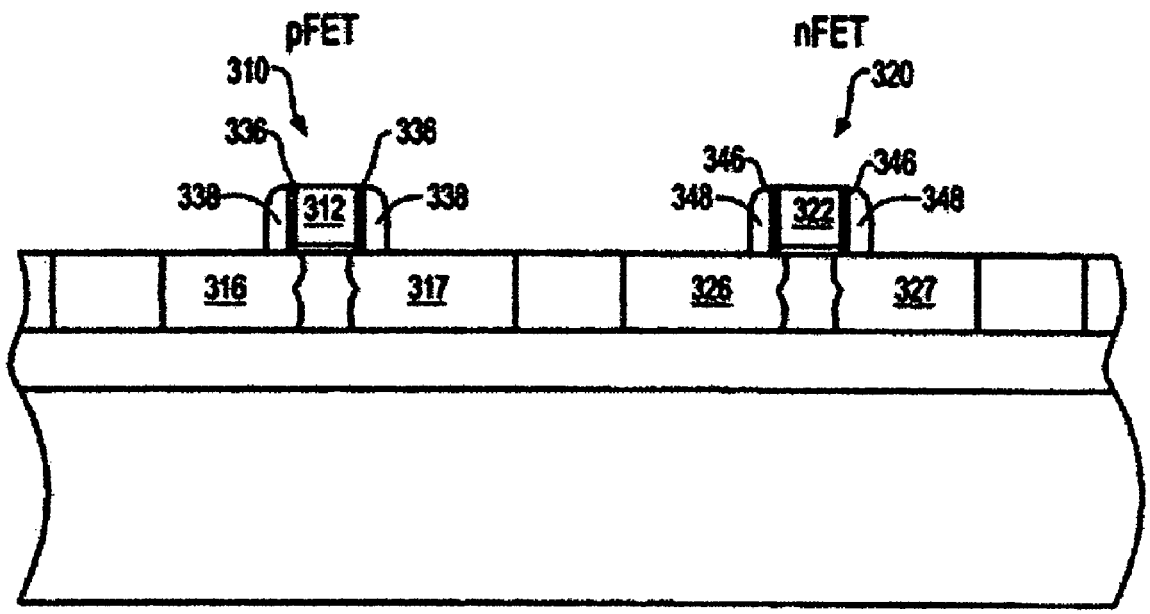

Subsequently, as illustrated in FIG. 8, using the gate stacks 315, 325 as masks, the active semiconductor regions 304a, 304b are deep implanted to establish the depth of the source and drain regions for each of the PFET and NFET, respectively. Implanting steps are performed in a manner as described above with reference to FIGS. 4 and 5, with the exception that gate stacks 315, 325 are used here as masks instead of sacrificial gate masks as described above. These implanting steps establish the depth of the source and drain regions as coinciding with the interface 352 to the BOX layer. Preferably, the source and drain regions 316, 317 of the PFET and the source and drain regions 326, 327 of the NFET have a predetermined dopant concentration at that interface of about $1 \times 10^{19}$ cm$^{-3}$. During these implanting steps, the dielectric caps 332, 342 protect the relatively short gate conductors 312, 322 and the gate dielectric layers 318, 328 which underlie them from being implanted too deeply and damaging them. The dielectric caps also protect the channel regions underlying the gate conductors from being counter-doped with the dopant being implanted into the source/drain regions. That is, the dielectric cap 342 protects the p-type doped channel region of the NFET from being counter-doped with the n-type source/drain dopant and the dielectric cap 332 protects the n-type doped channel region of the PFET from being counter-doped with the p-type source/drain dopant Referring to FIG. 9, subsequently, the dielectric caps are removed from above the gate conductors 312, 322, as by a wet etch process which attacks the material, e.g., silicon nitride, of the dielectric cap, while selectively preserving the materials such as polysilicon and oxide, which the gate conductors and STI regions preferably include. Implanting steps are then performed in a manner as described above with reference to FIG. 2 to complete the PFET 310 and the NFET 320. During the various implanting steps to form the PFET, the gate conductor 312 for the PFET and one or both spacers 336, 338 shown in FIG. 9 are used as a mask to prevent the channel region of the PFET from being implanted, in like manner to that described above relative to FIG. 2. During such implanting steps, the gate conductor 312 is implanted with an appropriate dopant. Likewise, during the implanting steps to form the NFET, the gate conductor 322 for the NFET and one or both spacers 346, 348 shown in FIG. 9 are used as a mask to prevent the channel region of the NFET from being implanted, and the gate conductor 322 is implanted with the appropriate dopant.

In one embodiment, the initial spacers 334 (FIG. 7) used during the initial deep implanting step are disposable spacers which are removed from the gate conductor 312 for the PFET before the new spacers 336, 338 are formed in their place. Likewise, the initial spacers 344 on the NFET gate conductor 322 can be removed prior to forming the final spacers 346, 348 in their place. This permits the final implanting steps to be controlled independently from the initial deep implanting step.

Alternatively, in a variation of such embodiment, the initial spacers 334, 344 can be allowed to remain in place, and are then used during the final implanting steps which define the extension and/or halo regions and the final source and drain regions for each transistor.

Figure 10:
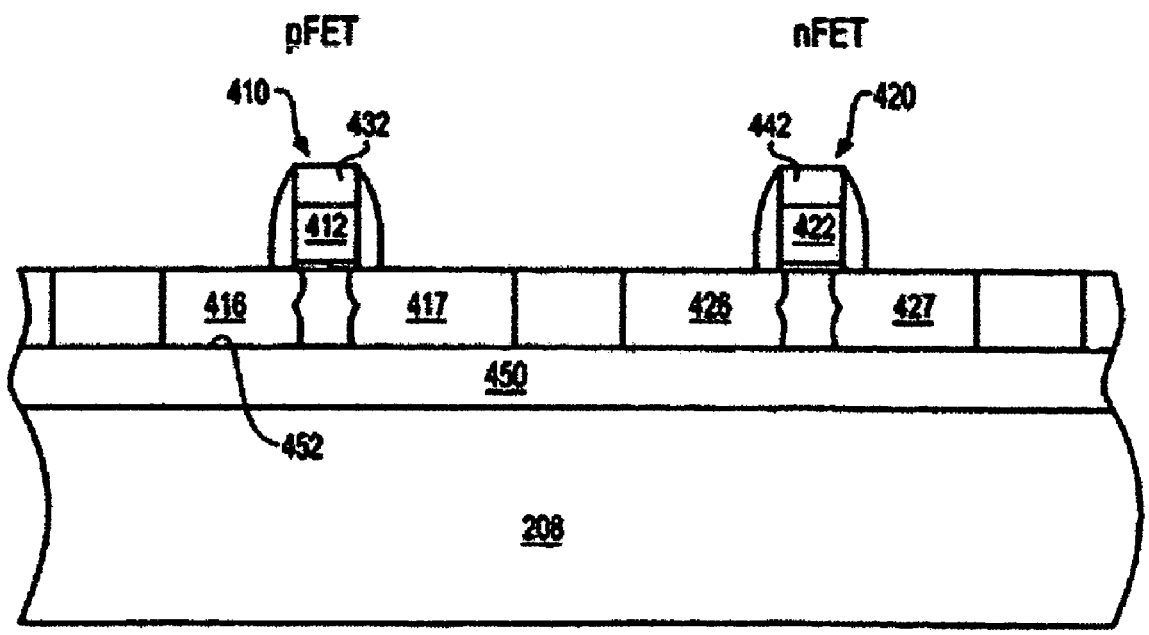
FIGS. 10 through 13 are sectional views illustrating stages in fabrication of a PFET and an NFET in accordance with a second embodiment of the invention.

In another variation of the above embodiment, deep implanting steps are performed to establish the depth of the source and drain regions at the interface 452 to the BOX layer 450 (FIG. 10), in a manner as described above with respect to FIGS. 7 and 8. Additional implanting steps are performed to form extension regions and/or halo regions and to define the edges of the source and drain regions 416, 417 of the PFET 410 in relation to the PFET gate conductor 412 and to form extension regions and/or halo regions and to define the edges of the source and drain regions 426, 427 of the NFET 420 in relation to the NFET gate conductor 422. However, unlike the embodiment described above relative to FIGS. 7 through 9, the dielectric, e.g., silicon nitride, caps 432, 442 remain in place. It will be apparent, because the structure of the dielectric caps and gate conductor patterns used as masks during the implants need not be altered, the additional implanting steps can be performed optionally either before or after performing the deep implanting steps.

With the dielectric caps 432, 442 remaining in place, they protect the gate poly conductors 412, 422 from being implanted when the additional implants are performed. In such case, the steps to implant the gate conductors to a desirable dopant concentration and profile can be separated from the implanting steps used to form the source and drain regions, and extensions and/or halo regions. The gate conductors can then be implanted with dopants by other processing described below with reference to FIGS. 11 through 13.

Figure 11:
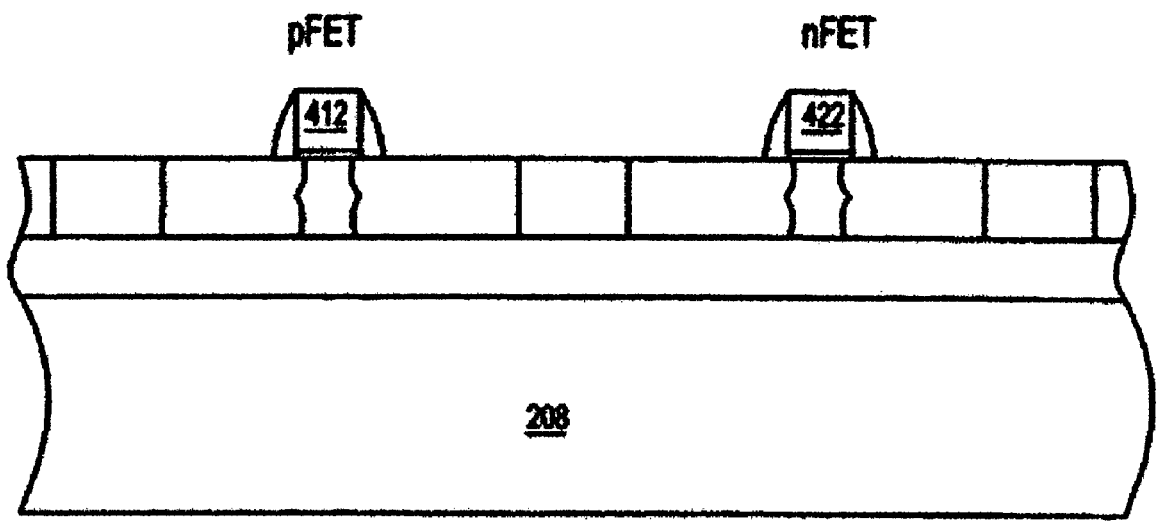
Figure 12:
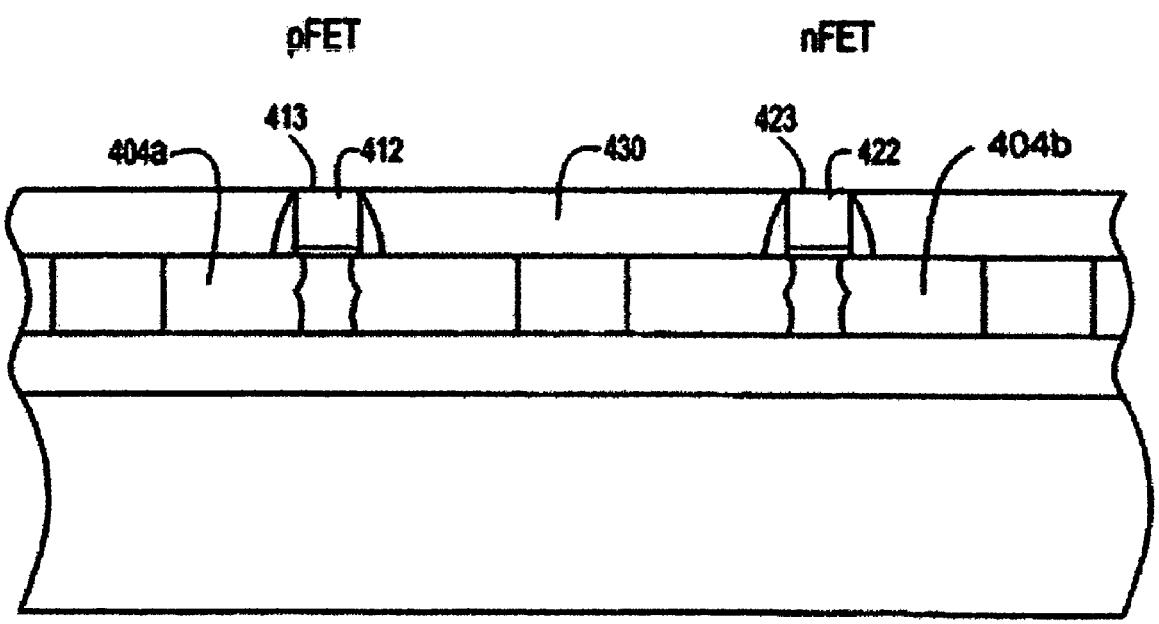

Thus, in a subsequent stage of processing, as illustrated in FIG. 11, the dielectric caps are removed from the gate stacks to expose the poly gate conductors 412, 422 underlying them. Thereafter, as illustrated in FIG. 12, a layer 430 of removable material, the material preferably having good gap filling characteristics is formed to cover the single-crystal silicon regions 404a, 404b of the substrate while exposing top surfaces 413, 423 of the poly gate conductor structures 412, 422. For example, some types of anti-reflective coating ("ARC"), spin-on-glass and CVD deposited borosilicate glass have good gap filling characteristics, among others, and can be deposited to form the layer 430 shown. Alternatively, a removable material such as a TEOS ("tetraethylorthosilicate") oxide or other material can be deposited and planarized to the top surfaces 413, 423 of the gate conductor structures by known techniques, e.g., chemical mechanical polishing ("CMP") to form layer 430.

Next, separate implanting steps are performed to implant each of the gate conductors with an appropriate dopant. Specifically, the gate conductor 412 for the PFET is implanted with a p-type dopant while an additional masking layer, e.g., patterned photoresist layer (not shown), covers the other gate conductor 422, and the gate conductor 422 for the NFET is implanted with an n-type dopant while an additional masking layer, e.g., patterned photoresist layer, covers the PFET gate conductor 412.

Figure 13:
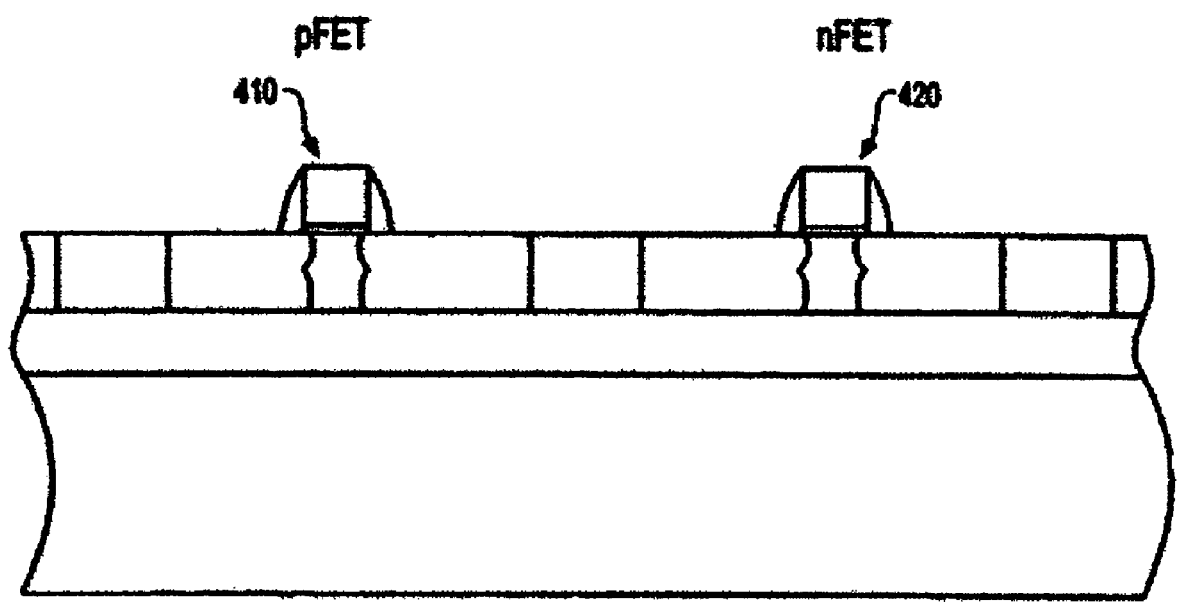

Subsequently, as illustrated in FIG. 13, the masking layer, e.g., ARC layer, etc., is removed to uncover the transistor structures for the PFET 410 and the NFET 420.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of fabricating a transistor structure, comprising the steps of: (a) providing a substrate including a semiconductor-on-insulator ("SOI") layer separated from a bulk region of said substrate by a buried dielectric layer; (b) first implanting said SOI layer to achieve a predetermined dopant concentration at an interface of said SOI layer to said buried dielectric layer; (c) second implanting said SOI layer to achieve predetermined dopant concentrations in a polycrystalline semiconductor gate conductor ("poly gate") and in source and drain regions disposed adjacent to said poly gate, wherein a maximum depth of said first implanting is greater than a maximum depth of said second implanting; and (d) said first and second implanting are conducted by performing said first implanting using said poly gate as a mask while a dielectric cap masks said poly gate from said first implanting, and then removing said dielectric cap prior to performing said second implanting step.

2. The method of claim 1, wherein said first implanting step is conducted as to achieve an implant having a peak dopant concentration which is just above the dielectric layer.

3. The method of claim 2, wherein said first implanting step produces a dopant concentration of about $10^{19}$ cm$^{-3}$ where said SOI layer meets said dielectric layer.

4. The method of claim 3, wherein said dielectric layer is a buried oxide (BOX) layer.

5. The method of claim 4, wherein a sacrificial gate is first formed in an area where said poly gate is to be subsequently formed, said sacrificial gate covering a greater surface area than said poly gate.

6. The method of claim 5, wherein said sacrificial gate is later removed and said poly gate and said source and drain regions are then formed.

7. The method of claim 6, wherein a length of said sacrificial gate is greater than a length of said poly gate by 20 to 30 nm.

8. The method of claim 1, further comprising a third implanting step of implanting said poly gate while simultaneously masking source and drain regions from being implanted.

* * * * *